United States Patent [19]

Yahata

[11] Patent Number: 5,384,475
[45] Date of Patent: Jan. 24, 1995

[54] SEMICONDUCTOR DEVICE AND METHOD OF MANUFACTURING THE SAME

[75] Inventor: Masamitsu Yahata, Kawasaki, Japan

[73] Assignee: Kabushiki Kaisha Toshiba, Kawasaki, Japan

[21] Appl. No.: 957,555

[22] Filed: Oct. 8, 1992

[30] Foreign Application Priority Data

Oct. 9, 1991 [JP] Japan .................. 3-261642

[51] Int. Cl.⁶ .............. H01L 23/48; H01L 21/265
[52] U.S. Cl. ...................... 257/314; 257/621;
257/773; 257/774; 437/29; 437/180; 437/203; 437/913; 437/954
[58] Field of Search ............ 257/774, 773, 621, 314; 437/29, 180, 203, 913, 954

[56] References Cited

U.S. PATENT DOCUMENTS

| | | | |
|---|---|---|---|
| 4,816,421 | 3/1989 | Dynes et al. | 257/774 |
| 4,982,244 | 1/1991 | Kapoor | 257/477 |
| 5,122,856 | 6/1992 | Komiya | 257/774 |

Primary Examiner—Edward Wojciechowicz
Attorney, Agent, or Firm—Finnegan, Henderson, Farabow, Garrett & Dunner

[57] ABSTRACT

When the present invention is used for an EPROM, diffused wiring regions for bit lines on a semiconductor substrate, epitaxial layers on the semiconductor substrate and the diffused wiring region, drain diffused regions and source diffused regions on the epitaxial layer are provided, and internal contacts for electrically connecting the diffused wiring regions to the drain diffused regions and the source diffused regions are formed. Contact holes indispensably need a predetermined size so as to preferably conduct, but the wirings are buried in the epitaxial layer to reduce or eliminate the contact holes and to improve integration.

19 Claims, 7 Drawing Sheets

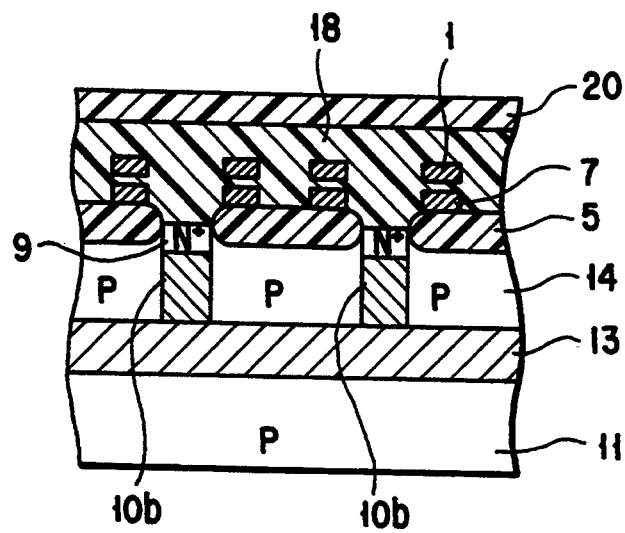
F I G. 4B
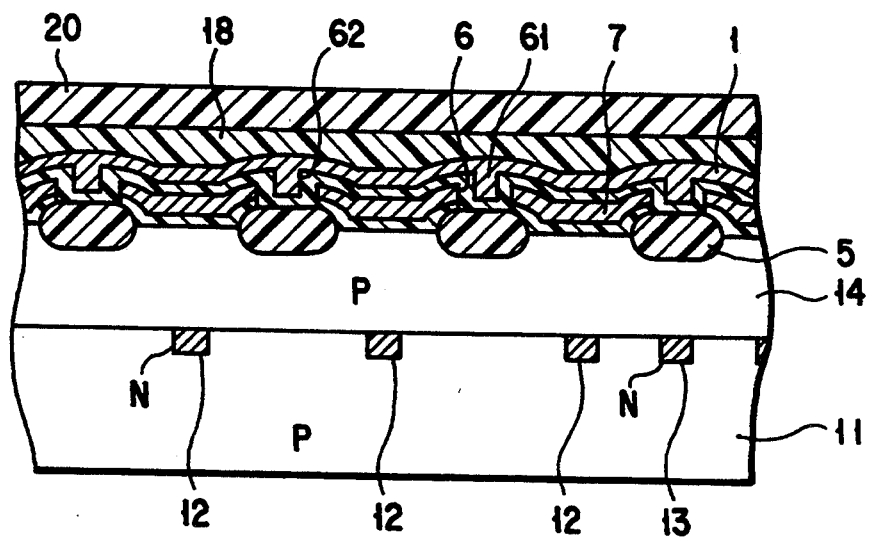
F I G. 4C

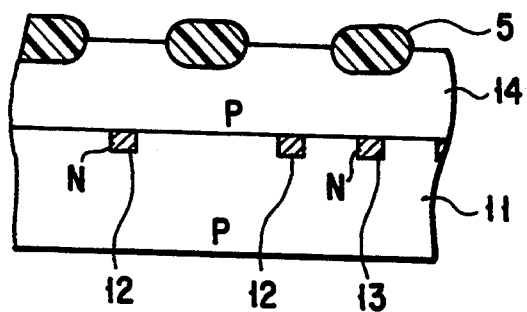
FIG. 5C-I
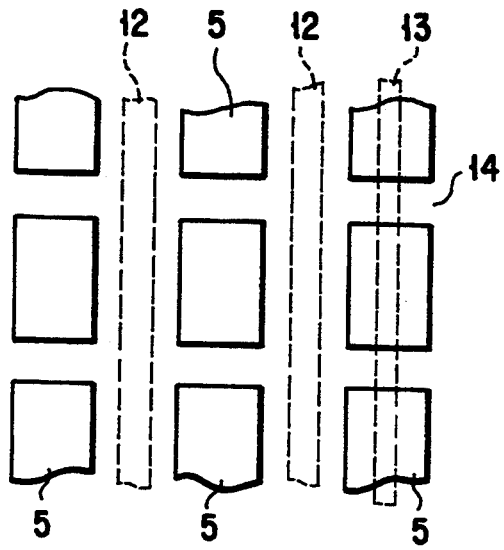
FIG. 5C-II
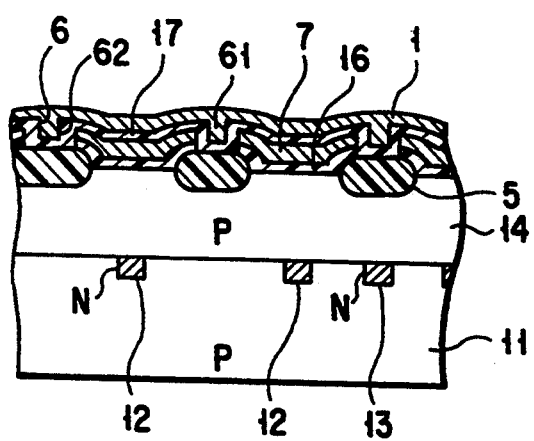
FIG. 5D-I
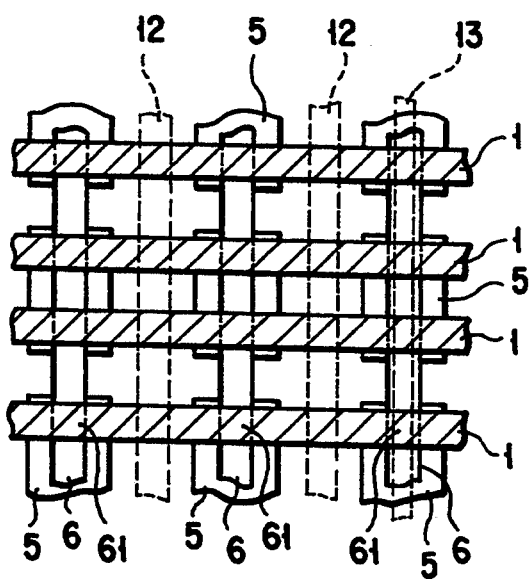
FIG. 5D-II

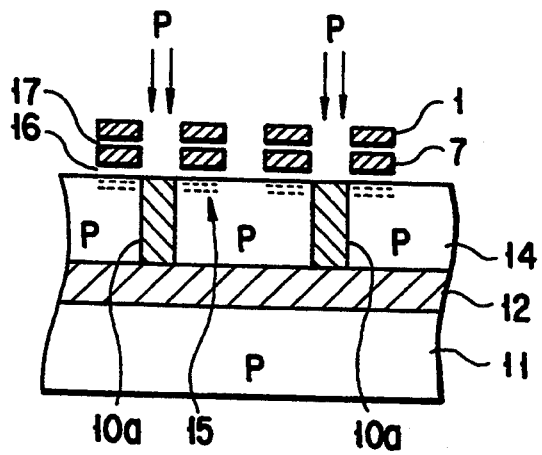
F I G. 5E-I
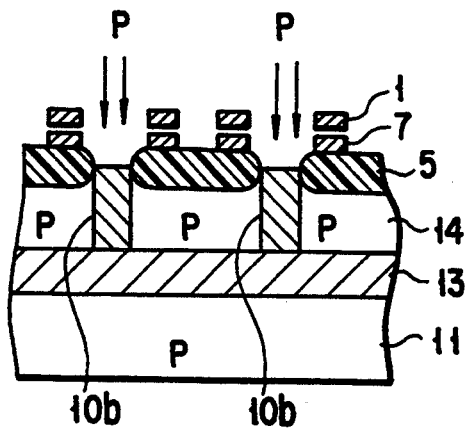
F I G. 5E-II
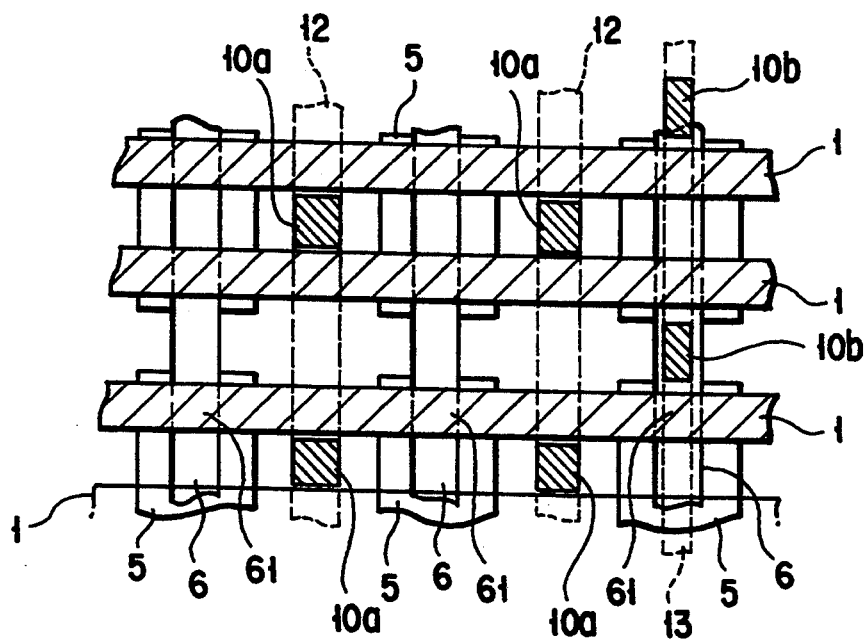
F I G. 5E-III

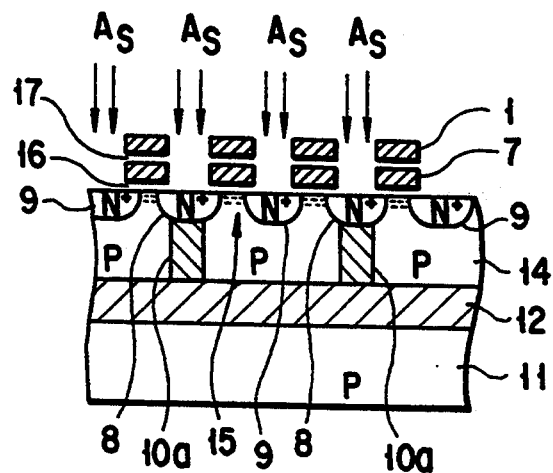
F I G. 5F-I
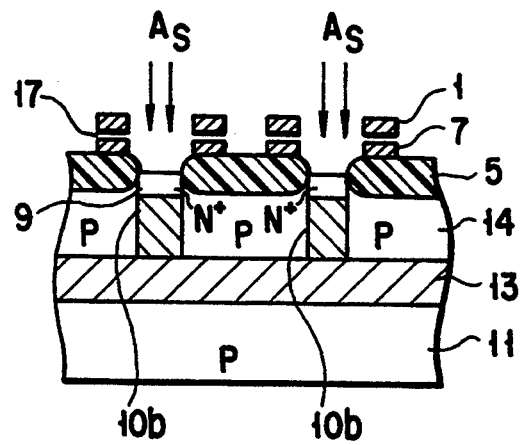
F I G. 5F-II
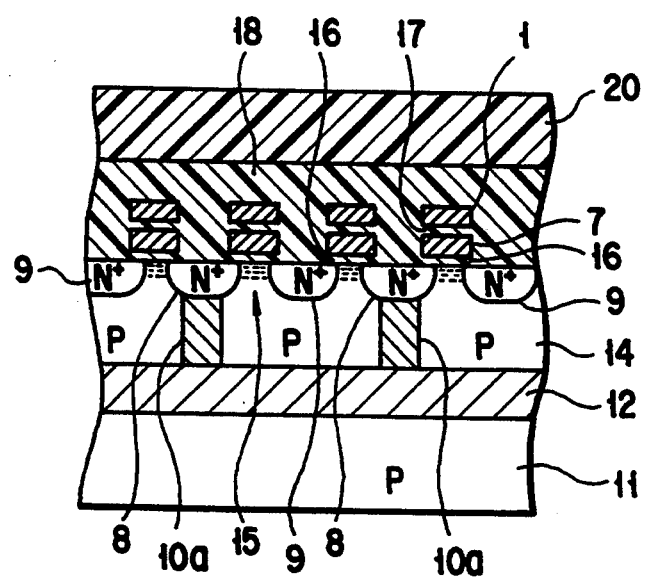
F I G. 5G

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, to a semiconductor device having an improved wiring structure and a method of manufacturing the same.

2. Description of the Related Art

Recently, miniaturization and high integration of elements are large subjects in a semiconductor integrated circuit in which its capacity is increased and advanced functions are employed. As an example of a conventional technique, an erasable and electrically programmable read only memory cell having a floating gate, i.e., an EPROM will be described below.

FIG. 1 is a plan view showing a portion of a conventional EPROM memory cell. FIG. 2 is a sectional view taken along lines D-D' of FIG. 1. In an EPROM cell, similarly to an ordinary MOS type FET, a drain region 8 and a source region 9 are provided separately through a channel region 15 on the surface of a semiconductor substrate 11. A floating gate 7 is so provided on the channel region 15 through a first gate insulating film 16 as to be completely insulated from the periphery. A control gate 1 is provided on the floating gate 7 through a second gate insulating film 17. The respective drain regions 8 and channel regions 15 are insulated by element isolating regions 5 to form cells, and the source regions 9 are so aligned in a direction perpendicular to the element isolating regions 5 as to hold the respective drain regions 8 and channel regions 15. The control gates run in parallel on the respective channel regions 15, and slits 6 of projections of the control gates 1 are disposed on the element isolating regions 5. The slit 6 is disposed under the control gate 1 of a slit region 61 on the element isolating region 5 to isolate the floating gate 7 on the channel region 15 of each cell. The portion of the slit region 16 except the control gate 1 of the slit region 61 is filled with an interlayer insulating film 18. Bit lines 2 and source lines 3 are formed in parallel with each other in a direction perpendicular to the control gates 1 and the source regions 9 on the substrate 11, the bit lines 2 are electrically conducted with the respective drain regions 8 in contact holes 4, and the source lines 3 are electrically conducted with the source region 9. An aluminum Al or an alloy in which silicon Si, copper Cu, etc., are added to the aluminum Al, is used as wirings of connections between elements, the bit lines 2, the source lines 3, etc., and the wirings are conducted with the drain regions 8 and the source regions 9 through the contact holes 4.

However, since the contact hole 4 indispensably needs a predetermined size so as to form a preferable contact, as understood from FIG. 1, the presence of the contact holes 4 disturbs miniaturization of the elements. Further, when the integration of a semiconductor integrated circuit is improved, total length of the wirings is increased, whereas the width of the wirings is narrowed, its current density is increased, and aspect ratio of the contact holes is increased. Thus, the wirings become weak against heat and electric stress, and problems such as wire disconnection, and a decrease in reliability arise.

SUMMARY OF THE INVENTION

It is an object of the present invention to provide a semiconductor device and a method of manufacturing the same wherein diffused layer regions formed in a semiconductor substrate are used as bit lines and source lines to eliminate contact holes or to reduce the number of contact holes so as to improve integration and to improve reliability of wirings.

According to an aspect of the present invention, there is provided a semiconductor device comprising: a first conductivity type semiconductor substrate; a second conductivity type diffused wiring region formed on the surface of the semiconductor substrate; a first conductivity type epitaxial layer formed on the surface of the semiconductor substrate including the diffused wiring region; a second conductivity type element region formed on the surface of the epitaxial layer; and a second conductivity type internal contact for electrically connecting the diffused wiring region to the element region.

According to another aspect of the present invention, there is provided a semiconductor device comprising: a first conductivity type semiconductor substrate; second conductivity type common source regions aligned separately on the surface of the semiconductor substrate; second conductivity type drain regions disposed along the source regions and separated from the source regions through channel regions; gate electrodes disposed on the channel regions; second conductivity type first diffused wiring regions disposed in the semiconductor substrate under the drain regions to extend in a direction perpendicular to the source regions; second conductivity type second diffused wiring regions disposed in the semiconductor substrate to extend along the first wiring regions; second conductivity type first internal contacts for conducting the drain regions with the first wiring regions; and second conductivity type second internal contacts for conducting the source regions with the second wiring regions.

According to still another aspect of the present invention, there is provided a method of manufacturing a semiconductor device comprising the steps of: forming a diffused wiring region by implanting a second conductivity type impurity in a predetermined region of a first conductivity type semiconductor substrate and diffusing the same; forming a first conductivity type epitaxial layer on the entire surface of the semiconductor substrate; forming an element isolating oxide film on a predetermined region of the epitaxial layer to isolate the same into element regions; forming a semiconductor element on the element region; and forming an internal contact region for electrically connecting the diffused wiring region to a predetermined region of the element region by implanting and diffusing a second conductivity type impurity above the diffused wiring region in the element region.

According to still another aspect of the present invention, there is provided a method of manufacturing a semiconductor device comprising the steps of: forming a diffused wiring region by implanting a second conductivity type impurity in a predetermined region of a first conductivity type semiconductor substrate and diffusing the same; forming a second conductivity type epitaxial layer on the semiconductor substrate; forming an element isolating field oxide film on a predetermined region of the epitaxial layer; forming a channel region by implanting a first conductivity type impurity to a predetermined region of the element region of the epitaxial layer; forming a first oxide film on the entire surface; forming a first polysilicon for a floating gate on the entire surface; diffusing a second conductivity type impurity in the first polysilicon; forming a slit for isolating the first polysilicon on the field oxide film; forming a second oxide film on the entire surface; forming a second polysilicon on the entire surface; forming a floating gate and a control gate by etching in a self-alignment the first oxide film, the first polysilicon, the second oxide film and the second polysilicon; forming first and second internal contacts by implanting and diffusing a second conductivity type impurity to a depth reaching the diffused wiring region in a predetermined region to be formed with the source region and the drain region of an element region; and forming a source region and a drain region by implanting a second conductivity type impurity.

Normally, the wirings are laid on the semiconductor substrate, the contact holes are formed, and the wirings are conducted with the elements. However, as described above, the diffused wiring regions are formed by impurity diffusing between the semiconductor substrate and the epitaxial layer, and the diffused wiring regions are electrically connected to the elements on the epitaxial layer by the internal contacts by the impurity diffused regions extending vertically, thereby reducing the number of the contact holes or eliminating the contact holes. Therefore, a space requirement for the contact holes is reduced, and integration is improved. Further, thinning of the wirings and an increase in the aspect ratio of the contact holes facilitate disconnection of wirings, and these fatal malfunctions are prevented, and reliability of the semiconductor device can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4B is a sectional view taken along lines B-B' in FIG. 3;

FIG. 4C is a sectional view taken along lines C-C' in FIG. 3; and

FIG. 5A-I, FIG. 5A-II, FIG. 5B, FIG. 5C-I, FIG. 5C-II, FIG. 5D-I, FIG. 5D-II, FIG. 5E-I, FIG. 5E-II, FIG. 5E-III, FIG. 5F-I, FIG. 5F-II, and FIG. 5G are sectional views or plan views for explaining manufacturing steps of a semiconductor device of the present invention.

DETAILED DESCRIPTION OF THE PREFERRED EMBODIMENT

An embodiment of a semiconductor device and a method of manufacturing the same of the present invention will be described below with reference to the accompanying drawings.

Figure 3:
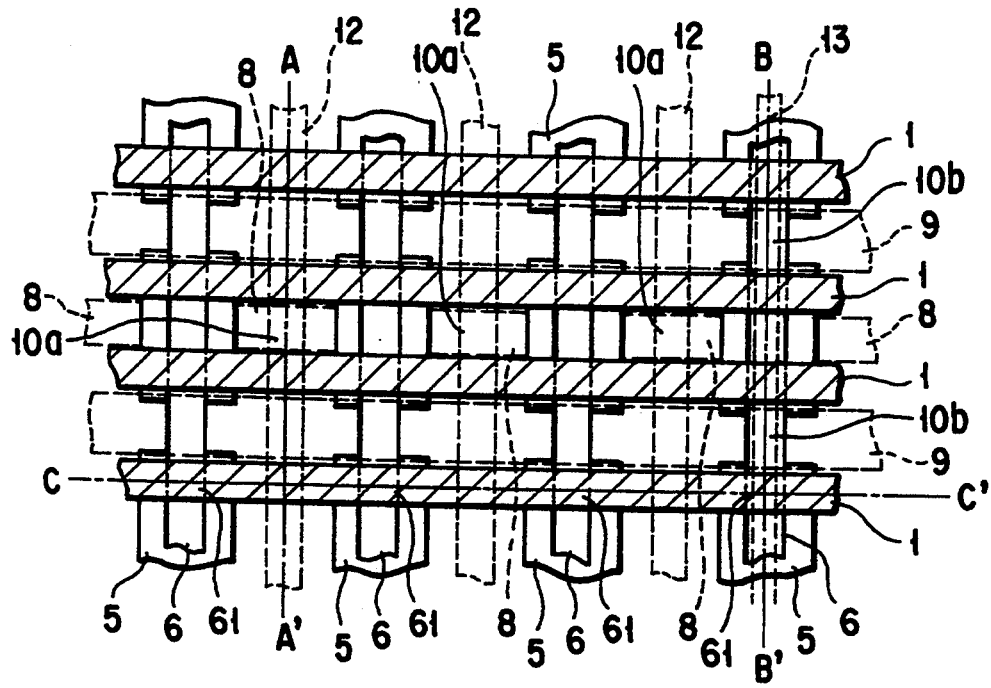
FIG. 3 is a plan view showing a portion of an EPROM memory cell region according to an embodiment of the present invention.
Figure 4A:
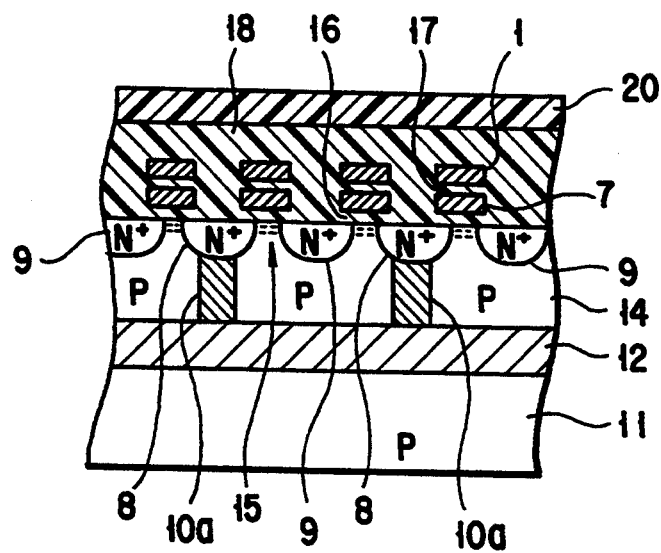
FIG. 4A is a sectional view taken along lines A-A' in FIG. 3.

FIG. 3 is a plan view showing a portion of an EPROM memory cell region of an embodiment of a semiconductor device according to the present invention. FIG. 4A is a sectional view taken along lines A-A' of FIG. 3. FIG. 4B is a sectional view taken along lines B-B' of FIG. 3. FIG. 4C is a sectional view taken along lines C-C' of FIG. 3. In the EPROM cell of this embodiment, as shown in FIG. 3, diffused wiring regions 12 for N-type bit lines and diffused wiring regions 13 for N-type source lines perpendicular to control gates 1 and source regions 9 are forced in parallel with each other in a semiconductor substrate 11. The diffused wiring regions 12 for the N-type bit lines are, as shown in FIG. 4A, connected to $N^+$-type drain regions 8 by N-type first internal contact 10a. The diffused wiring regions 13 for the N-type source lines are, as shown in FIG. 4B, connected to $N^+$-type source regions 9 by N-type second internal contact 9. The drain regions 8 and the source regions 9 of a P-type epitaxial layer 14 formed on the surface of the semiconductor substrate 11 are provided separately through channel regions 15. Floating gates 7 completely insulated from the periphery through first gate insulating films 16 are provided on the channel regions 15. Control gates 1 are provided through second gate insulating films 17 on the floating gates 7. The drain regions 8 and the channel regions 15 are insulated by element isolating regions 5 to constitute cells. The source regions 9 are so aligned in a direction perpendicular to the element isolating regions 5 as to hold the drain regions 8 and the channel regions 15. The control gates 1 run in parallel on the channel regions 15, and slits 6 of projections of the control gates 1 are formed at the element isolating regions 52. The slit 6 is disposed under the control gate 1 of the slit region 61 on the element isolating region 5 to isolate the floating gates 7 on the channel regions 15 of the respective cells. A portion of the slit region 61 except the control gate 1 is filled with an interlayer insulating film 18. A passivation film 20 is formed on the interlayer insulating film 18.

Figure 5B:
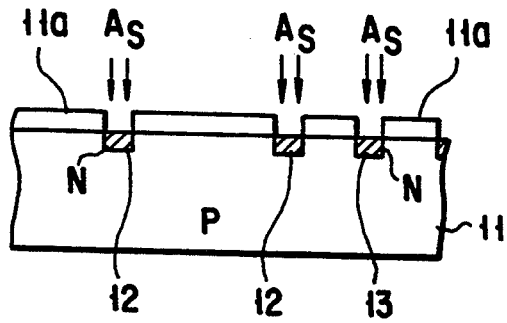
Figure 5B:
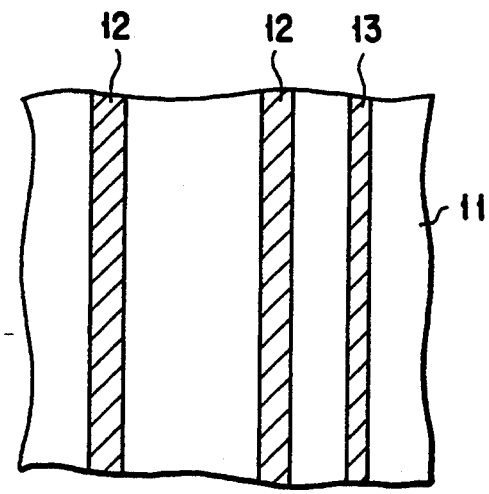
Figure 5B:
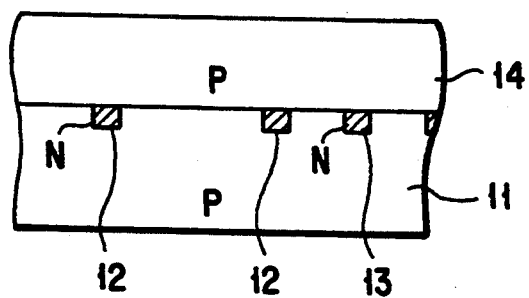

Then, a method of manufacturing the semiconductor device according to the present invention will be described in detail with reference to FIG. 5A-I to FIG. 5G. First, as shown in FIG. 5A-I, a mask 11a is formed on a region except a region of internal wirings for the bit lines and the source lines on the surface of a P-type semiconductor substrate 11. Then, arsenic of an N-type impurity is, for example, implanted by an ion implantation to form a predetermined wiring pattern having a concentration about $1 \times 10^{17} cm^{-3}$ and a depth about 0.2 $\mu m$ such as diffused wiring regions 12 for the bit lines and diffused wiring regions 13 for the source lines, for example, in parallel vertically isolated as shown in FIG. 5A-II. Subsequently, as shown in FIG. 5B, a P-type epitaxial layer 14 is formed about 1 $\mu m$ thick on the semiconductor substrate 11. An EPROM element is formed on the surface of the epitaxial layer 14 according to a conventional method. That is, as shown in FIGS. 5C-I and 5C-II, in order to isolate memory cells by a method such as an improved LOCOS, etc., the element isolating regions 5 are formed of field oxide films on the surface of the epitaxial layer 14 of a region between the diffused wiring regions 12 for the bit lines and a region on the diffused wiring regions 13 for the source lines in parallel with the diffused wiring regions 12 for the bit lines and the diffused wiring regions 13 for the source lines previously formed. The element isolating regions 5 are so formed about 800 nm as to isolate the drain regions 8 to be formed later and to obtain the source regions 9. Then, boron of a P-type impurity is, for example, implanted in concentration of about $1 \times 10^{23}$ cm$^{-3}$ by an ion implanting method, etc., to form the channel regions 15 under a region of the control gates 1 to be formed later between the element isolating regions 5 in a direction perpendicular to the diffused wiring regions 12 for the bit lines and the diffused wiring regions 13 for the source lines (FIG. 5E-I). Thereafter, as shown in FIG. 5D-I, first gate insulating films 16 of about 30 nm are formed on the epitaxial layer 14 on the entire surface of a memory area by using, for example, hydrochloric acid. The thickness of the first gate insulating film may be so set as to have a tunneling effect. Then, a first polysilicon layer for forming the floating gates 7 independent at the respective cells is deposited about 400 nm thick on the entire surface of the first gate insulating film 16 by, for example, CVD method. An N-type impurity such as phosphorus, etc., is diffused in concentration about $1 \times 10^{20} - 10^{21}$ cm$^{-3}$ in the first polysilicon layer. Slit regions 61 for removing the first polysilicon film and the first gate insulating film 16 and isolating the floating gates 7 are formed on the element isolating region 5 by a dry etching method, etc., in a direction parallel to the diffused wiring regions 12 for the bit lines and the diffused wiring regions 13 for the source lines. Thereafter, it is heat treated at 900° C. or more, and the second gate insulating film 17 is formed about 40 nm thick on the first polysilicon film and the slit region 61. Slot holes 62 are formed on the second gate insulating films 17 of the slit regions 61. Then, the second polysilicon film of about 400 nm is deposited on the second gate insulating film 17, simultaneously buried in the slit hole 62, and N-type impurity is implanted in the second polysilicon layer in concentration of $1 \times 10^{20}$ to $10^{21}$ cm$^{-3}$. Then, the second polysilicon layer is etched by a dry etching method, and the control gates 1 extending in parallel on the channel region 15 and the slits 6 formed by burying in the slot holes 62 are formed. Thereafter, the second gate insulating layer 17 and the first polysilicon layer are etched by a self-alignment technique, and the floating gates 7 are formed under the control gates 1. A step of forming a peripheral circuit elements may be included on the way of the above steps. Subsequently, an N-type impurity such as, for example, phosphorus of 120 keV, about $1 \times 10^{13}$ cm$^{-2}$ is implanted by a spot ion implantation only in a region for connecting the drain diffused region 8 to be formed later to the formed diffused wiring region 12 for the bit line, as shown in FIG. 5E-I, and a region for connecting the source diffused region 9 to be formed later to the formed diffused wiring region 13 for the source line, as shown in FIG. 5E-II, and annealed to form the first and second internal contacts 10a and 10b extending vertically. This ion implantation uses a high acceleration ion implantation. In FIG. 5E-III, the first internal contact 10a is formed only on the portion of the drain region 8 to be formed later, but the first internal contact 10a may be formed on the entire region of the drain region 8. The second internal contact 10b may be so formed between the element isolating regions 5 as to have the wider width than that of the diffused wiring region for the source line. Then, as shown in FIGS. 5F-I and 5F-II, with the control gate 1 and the floating gate 7 used as masks, arsenic ions, etc., of about $1 \times 10^{15}$ cm$^{-3}$ $^{12}$ are implanted in a self-alignment, and annealed to form the drain diffused region 8 and the common source diffused region 9 between the control gates 1 on the epitaxial layer 14. Finally, as shown in FIG. 5G, the interlayer insulating film 18 is deposited on the entire surface to bury the slot holes 61; and further the passivation film 20 is formed on the insulating film 18.

Of course, after the drain diffused region 8 and the source diffused region 9 are formed in a self-alignment, the first and second internal contacts 10a and 10b extending vertically may be formed. Otherwise, before the control gates 1 are formed, the drain region 8 and the source region 9 may be formed. In the foregoing description, the P-type semiconductor substrate is used. However, similar wiring structure may be realized by using an N-type semiconductor substrate. Further, the embodiment may also be used for other semiconductor elements of the EPROM.

Figure 1:
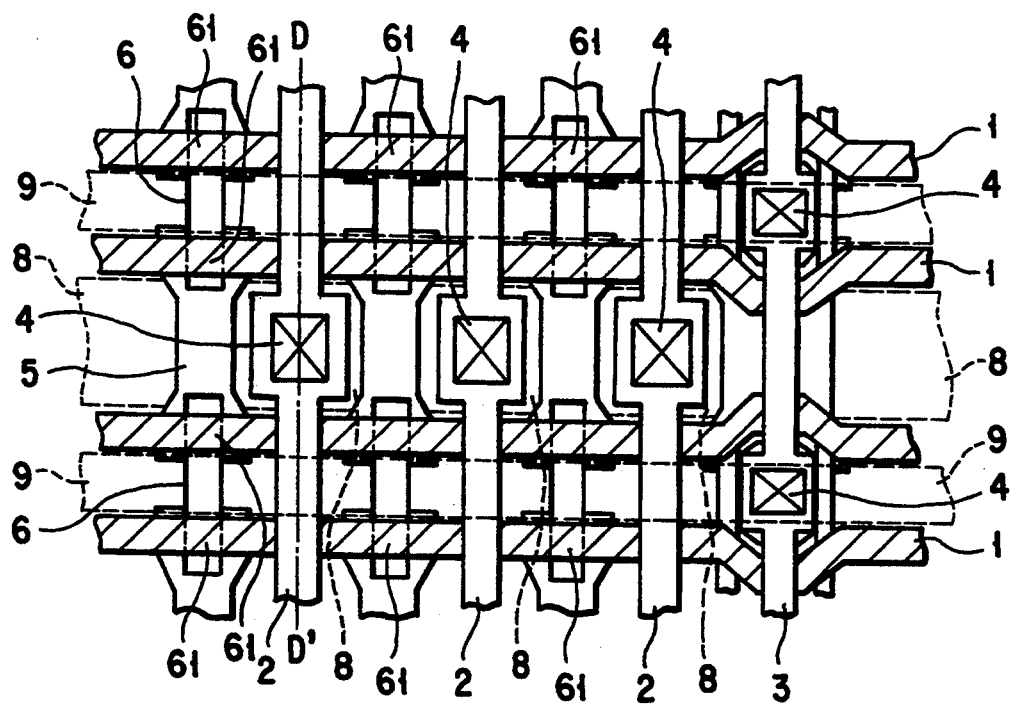
FIG. 1 is a plan view showing a portion of a conventional EPROM memory cell region.
Figure 2:
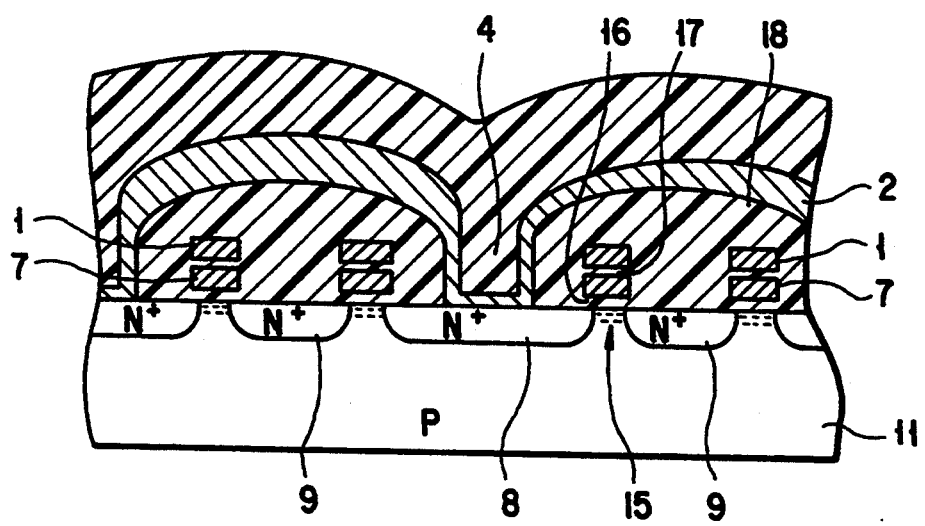
FIG. 2 is a sectional view taken along lines D-D' in FIG. 1.

Heretofore, as shown in FIG. 1, the bit lines 2 and the source lines 3 are laid on the substrate. However, in the EPROM formed as described above, the bit lines and the source lines are respectively buried as the diffused wiring regions 12 for the bit lines and the diffused wiring regions 13 for the source lines in the substrate 11, and only the floating gates 7 and the control gates 1 are provided on the substrate 11. Therefore, the wiring may be performed without forming the contact holes 4 as shown in FIG. 1. In the case where the present invention is applied only the memory cell region of 1M EPROM by using 1.2 μm processing rule, the size of the conventional cell is 4.3 μm×4.6 μm, whereas the size of the cell according to the present invention is reduced to 4.3 μm×2.4 μm, and hence the size of the cell can be reduced by about 52%. According to the wiring method using the diffused layers, a large merit is that the size of the cell can be reduced, and the total extension of the wirings may be shortened by reducing the size of the entirety. Further, the present invention is used for a region necessary for microscopic wirings and a region necessary for contact holes having a large aspect ratio, thereby preventing fatal malfunction due to wire disconnection and improving reliability.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a first conductivity type semiconductor substrate;
   a second conductivity type diffused wiring region formed on a surface of said semiconductor substrate, said diffused wiring region comprising a plurality of lines each of which is isolated from each other and extends in a line;
   a first conductivity type epitaxial layer formed on a surface of said semiconductor substrate including said diffused wiring region;

a second conductivity type element region formed on a surface of said epitaxial layer; and a second conductivity type internal contact, formed by a diffused region, for electrically connecting said diffused wiring region to said element region.

2. A semiconductor device according to claim 1, wherein the impurity concentration of said diffused wiring region is higher than that of source region and drain region to be formed in said element region.

3. A semiconductor device according to claim 1, wherein the impurity concentration of said internal contact is lower than that of source region and drain region to be formed in said element region.

4. A semiconductor device comprising:
a first conductivity type semiconductor substrate;
second conductivity type common source regions aligned separately on a surface of said semiconductor substrate;
second conductivity type drain regions disposed along said source regions and separated from said source regions through channel regions;
gate electrodes disposed on said channel regions;
second conductivity type first diffused wiring regions disposed in said semiconductor substrate under said drain regions to extend in a line in a direction perpendicular to said source regions;
second conductivity type second diffused wiring regions disposed in said semiconductor substrate to extend in a line along said first wiring regions;
second conductivity type first internal contacts, formed by diffused regions, for conductively connecting said drain regions with said first wiring regions; and
second conductivity type second internal contacts, formed by diffused regions, for conductively connecting said source regions with said second wiring regions.

5. A semiconductor device according to claim 4, wherein the impurity concentrations of said first and second diffused wiring regions are higher than those of said common source region and said drain region.

6. A semiconductor device according to claim 4, wherein the impurity concentrations of said first and second internal contacts are lower than those of said common source region and said drain region.

7. A semiconductor device according to claim 4, wherein said first wiring regions are bit lines extending parallel to each other in a direction perpendicular to said source regions, said second wiring regions are source lines extending parallel to said first wiring regions, and said first and second internal contacts are formed perpendicularly to the surface of said semiconductor substrate.

8. A semiconductor device according to claim 7, wherein said source regions are held at a predetermined interval, and disposed parallel to each other, said gate electrodes are extended parallel to said source regions, and have floating gates electrically insulated from the periphery thereof on said channel regions and under said gate electrodes.

9. A semiconductor device according to claim 4, wherein a gate oxide film formed between said floating gate and said semiconductor substrate is formed of an oxide film having a tunneling effect.

10. A method of manufacturing a semiconductor device comprising the steps of:
forming a plurality of diffused wiring regions by implanting a second conductivity type impurity in a predetermined region of a first conductivity type semiconductor substrate and diffusing the same, each of said plurality of diffused wiring regions being formed in a line and to be isolated from each other;
forming a first conductivity type epitaxial layer on an entire surface of said semiconductor substrate;
forming element isolating oxide films on predetermined regions of said epitaxial layer to isolate said epitaxial layer into element regions;
forming semiconductor elements on said element regions; and
forming internal contact regions for electrically connecting said diffused wiring regions to predetermined regions of said element regions by implanting and diffusing a second conductivity type impurity above said diffused wiring regions in said element regions.

11. A method of manufacturing a semiconductor device according to claim 10, wherein said diffused wiring regions are formed as bit lines and source lines.

12. A method of manufacturing a semiconductor device according to claim 11, wherein a source region, a drain region, a channel region and a gate electrode are formed by a step for forming said semiconductor element.

13. A method of manufacturing a semiconductor device according to claim 12, wherein said internal contact connects said bit-line to said drain region and said source line to said source region.

14. A method of manufacturing a semiconductor device according to claim 10, wherein the impurity concentration of said diffused wiring region is higher than that, of source region and drain region of said semiconductor element.

15. A method of manufacturing a semiconductor device according to claim 10, wherein the impurity concentration of said internal contact is lower than that of source region and drain region of said semiconductor element.

16. A method of manufacturing a semiconductor device comprising the steps of:
forming a diffused wiring region by implanting a second conductivity type impurity in a predetermined region of a first conductivity type semiconductor substrate and diffusing the same;
forming a second conductivity type epitaxial layer on said semiconductor substrate;
forming an element isolating field oxide film on a predetermined region of said epitaxial layer;
forming a channel region by implanting a first conductivity type impurity to a predetermined region of the element region of said epitaxial layer;
forming a first oxide film on the entire surface;
forming a first polysilicon for a floating gate on the entire surface;
diffusing a second conductivity type impurity in said first polysilicon;
forming a slit for isolating said first polysilicon on said field oxide film;
forming a second oxide film on the entire surface;
forming a second polysilicon on the entire surface:
forming a floating gate and a control gate by etching in a self-alignment said first oxide film, said first polysilicon, said second oxide film and said second polysilicon;
forming first and second internal contacts by implanting and diffusing a second conductivity type impurity to a depth reaching said diffused wiring region in a predetermined region to be formed with the source region and the drain region of an element region; and forming a source region and a drain region by implanting a second conductivity type impurity.

17. A semiconductor device according to claim 1, wherein each of said plurality of lines of said second conductivity type diffused wiring region extends in a straight line.

18. A semiconductor device according to claim 4, wherein each of said second conductivity type first diffused wiring regions extends in a straight line, and each of said second conductivity type second diffused wiring regions extends in a straight line.

19. A semiconductor device according to claim 10, wherein said each of said plurality of diffused wiring regions is formed in a straight line.

* * * * *